(12) United States Patent
Park et al.

(10) Patent No.: US 11,631,354 B2
(45) Date of Patent: Apr. 18, 2023

(54) LIGHT EMITTING DISPLAY DEVICE INCLUDING A SENSING CIRCUIT AND METHOD OF DRIVING THE SAME

(71) Applicant: LG Display Co., Ltd., Seoul (KR)

(72) Inventors: Sang Hyun Park, Seoul (KR); Chan Hui Seol, Sokcho-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/496,573

(22) Filed: Oct. 7, 2021

(65) Prior Publication Data
US 2022/0157215 A1    May 19, 2022

(30) Foreign Application Priority Data

Nov. 17, 2020    (KR) .......................... 10-2020-0153521

(51) Int. Cl.
*G09G 3/3266* (2016.01)
*G09G 3/20* (2006.01)
*G11C 19/28* (2006.01)
*G09G 3/3291* (2016.01)
*G09G 3/3258* (2016.01)

(52) U.S. Cl.
CPC ............. *G09G 3/20* (2013.01); *G09G 3/3266* (2013.01); *G11C 19/28* (2013.01); *G09G 3/3258* (2013.01); *G09G 3/3291* (2013.01); *G09G 2300/0842* (2013.01); *G09G 2310/0267* (2013.01); *G09G 2310/0286* (2013.01); *G09G 2310/0289* (2013.01); *G09G 2310/08* (2013.01); *G09G 2320/045* (2013.01); *G09G 2330/02* (2013.01); *G09G 2330/045* (2013.01); *G09G 2330/12* (2013.01)

(58) Field of Classification Search
CPC ............. G09G 3/20; G09G 2310/0267; G09G 2310/0286; G09G 2310/08; G09G 2330/02; G09G 3/3266; G09G 3/3291; G09G 3/3258; G09G 2300/0842; G09G 2310/0289; G09G 2320/045; G09G 2330/12; G09G 2330/045; G11C 19/28
See application file for complete search history.

(56) References Cited

U.S. PATENT DOCUMENTS

2014/0176525 A1 * 6/2014 Woo ..................... G09G 3/3233
345/212

FOREIGN PATENT DOCUMENTS

KR         2015061548 A  *  6/2015  .......... G09G 3/3233
KR     1020170081033 A  *  7/2017  .......... G09G 3/3275
KR       10-2019-0070046 A    6/2019

* cited by examiner

*Primary Examiner* — Adam J Snyder
(74) *Attorney, Agent, or Firm* — Seed IP Law Group LLP

(57) ABSTRACT

A display device includes a display panel including a sub-pixel for displaying an image, a data driver configured to apply a data voltage to a data line of the sub-pixel, and a scan driver configured to apply a gate signal to a gate line of the sub-pixel. A gate voltage of the gate signal is compensated based on a sensing voltage sensed from the sub-pixel.

15 Claims, 17 Drawing Sheets

LIGHT EMITTING DISPLAY DEVICE INCLUDING A SENSING CIRCUIT AND METHOD OF DRIVING THE SAME

This application claims the benefit of Korean Patent Application No. 10-2020-0153521, filed on Nov. 17, 2020, which is hereby incorporated by reference as if fully set forth herein.

BACKGROUND

Technical Field

The present disclosure relates to a light emitting display device and a method of driving the same.

Description of the Related Art

The development of information technology has brought the growth of the market for display devices, which are a connection medium between users and information. Accordingly, display devices such as a light emitting display (LED) device, a quantum dot display (QDD) device, and a liquid crystal display (LCD) device are increasingly used.

Such a display device includes a display panel including sub-pixels, a driver that outputs a driving signal for driving the display panel, and a power supply that generates power to be supplied to the display panel or the driver.

In the display device, when driving signals such as scan signals and data signals are applied to sub-pixels formed on the display panel, the selected sub-pixel transmit light or emit light directly, thereby displaying an image.

BRIEF SUMMARY

Accordingly, the present disclosure is directed to a light emitting display device and a method of driving the same that substantially obviate one or more problems due to limitations and disadvantages of the related art.

The present disclosure is intended to increase the lifetime of a device and improve the driving stability and reliability of the device by evaluating and compensating the driving capability or deterioration of a switching transistor, a sensing transistor, and a driving transistor included in a sub-pixel.

Additional advantages and features of the disclosure will be set forth in part in the description which follows and in part will become apparent to those having ordinary skill in the art upon examination of the following or may be learned from practice of the disclosure. The technical benefits and other advantages of the disclosure may be realized and attained by the structure particularly pointed out in the written description and claims hereof as well as the appended drawings.

To achieve these benefits and other advantages, as embodied and broadly described herein, a display device includes a display panel including a sub-pixel for displaying an image, a data driver configured to apply a data voltage to a data line of the sub-pixel, and a scan driver configured to apply a gate signal to a gate line of the sub-pixel. A gate voltage of the gate signal is compensated based on a sensing voltage sensed from the sub-pixel.

A level of the gate voltage for turning on at least one of a switching transistor or a sensing transistor included in the sub-pixel may be changed based on the sensing voltage sensed from the sub-pixel.

The level of the gate voltage may be raised in correspondence with a decrease in the driving capability of at least one of the switching transistor or the sensing transistor.

A compensator for compensating the gate voltage may include a sensing circuit configured to obtain the sensing voltage sensed from the sub-pixel, a voltage controller configured to output a voltage control signal for changing the gate voltage based on the sensing voltage received from the sensing circuit, a power supply configured to compensate the gate voltage in response to the voltage control signal and outputting the compensated gate voltage, and a shift register configured to receive the compensated gate voltage from the power supply and output a gate signal compensated based on the compensated gate voltage.

The shift register may be configured to receive a compensated first gate voltage from the power supply and output a scan signal for turning on the switching transistor based on the compensated first gate voltage, and receive a compensated second gate voltage from the power supply and output a sense signal for turning on the sensing transistor based on the compensated second gate voltage.

The sensing circuit may be configured to obtain the sensing voltage through a reference line of the sub-pixel.

In another aspect of the present disclosure, a display device includes a display panel including a sub-pixel for displaying an image, and a compensator configured to apply a sensing data voltage and a reference voltage to the sub-pixel and compensate the switching capability of at least one of transistors included in the sub-pixel based on a sensing voltage sensed from a sensing node of the sub-pixel.

The compensator may be configured to compensate a gate voltage for turning on the at least one of the transistors included in the sub-pixel.

The compensator may include a sensing circuit configured to obtain the sensing voltage, and a shift register configured to receive a compensated gate voltage generated based on the sensing voltage and output a gate signal compensated based on the compensated gate voltage.

In another aspect of the present disclosure, a method of driving a display device includes obtaining a sensing value from a sub-pixel of a display panel displaying an image, and when the sensing value is different from an initial value obtained during initial driving, compensating the switching capability of the at least one of transistors included in the sub-pixel.

The compensation may include changing a gate voltage for turning on the at least one of the transistors included in the sub-pixel.

The compensation may include raising a gate high voltage in correspondence with a decrease in the driving capability of at least one of a switching transistor or a sensing transistor included in the sub-pixel.

It is to be understood that both the foregoing general description and the following detailed description of the present disclosure are explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

A display device according to the present disclosure may be implemented as, but not limited to, a television, a video player, a personal computer (PC), a home theater, a vehicle electric device, a smartphone, or the like. The display device according to the present disclosure may be implemented as a light emitting diode (LED) device, a quantum dot display (QDD) device, a liquid crystal display (LCD) device, or the like. However, the following description is given in the context of a light emitting display device that directly emits light based on inorganic LEDs or organic LEDs as an example, for convenience of description.

While the light emitting display device is described below as including n-type or p-type thin film transistors by way of example, the light emitting display device may be implemented to include n-type and p-type thin film transistors together. Each thin film transistor is a three-electrode device including a gate, a source, and a drain. The source is an electrode that supplies carriers to the transistor. In the thin film transistor, the carriers start flowing from the source. The drain is an electrode through which the carriers exit from the thin film transistor. That is, the carriers flow from the source to the drain in the thin film transistor.

In the case of a p-type thin film transistor, because carriers are holes, a source voltage is higher than a drain voltage so that the holes may flow from the source to the drain. As the holes flow from the source to the drain, current flows from the source to the drain in the p-type thin film transistor. In contrast, in the case of an n-type thin film transistor, carriers are electrons. Therefore, the source voltage is lower than the drain voltage so that the electrons may flow from the source to the drain. In the n-type thin film transistor, since the electrons flow from the source to the drain, the current flows from the drain to the source. However, the source and drain of a thin film transistor may be exchanged according to an applied voltage. In this context, the following description is given with the appreciation that one of the source and the drain is referred to as a first electrode, and the other of the source and the drain is referred to as a second electrode.

Figure 1:
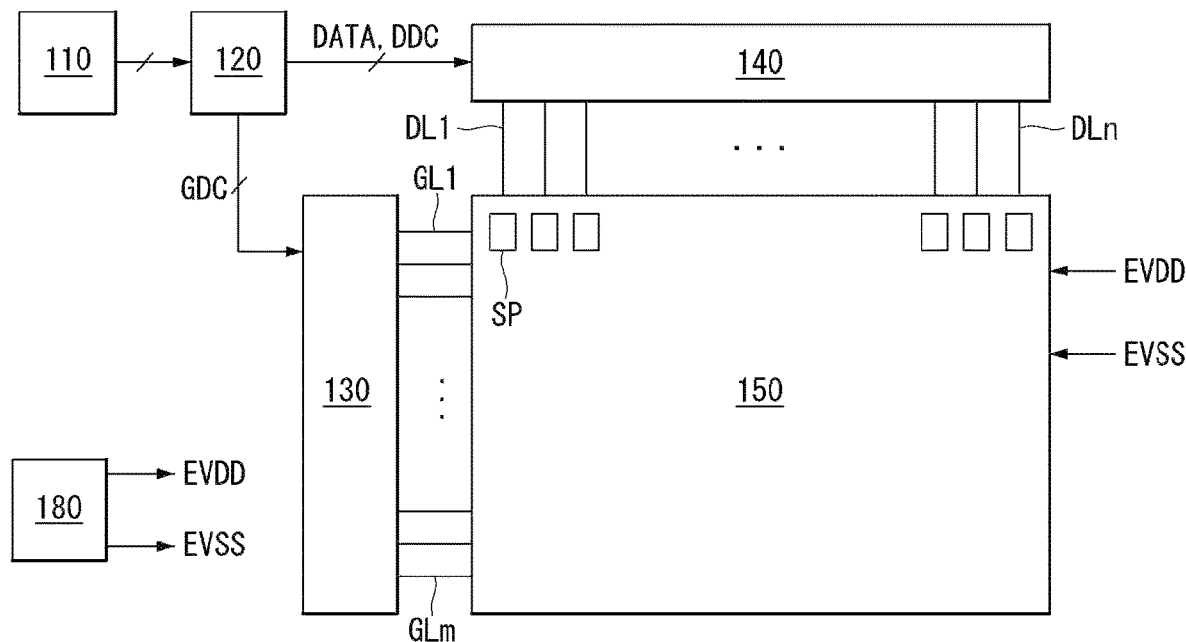
FIG. 1 is a block diagram illustrating a light emitting display device according to an embodiment of the present disclosure.
Figure 2:
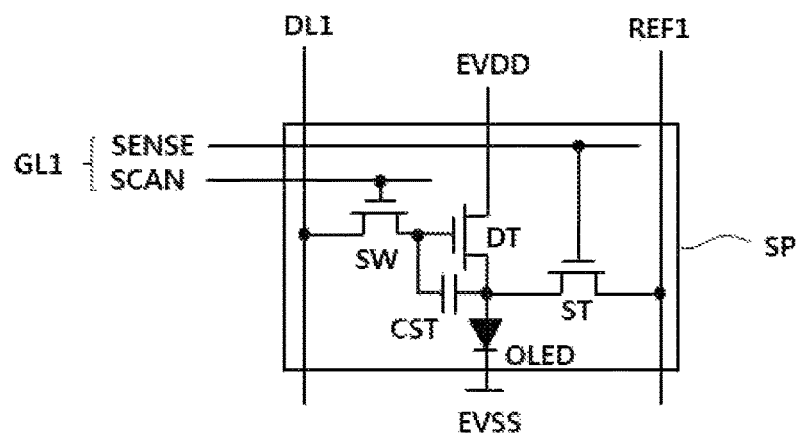
FIG. 2 is a diagram illustrating a sub-pixel illustrated in FIG. 1.

FIG. 1 is a block diagram illustrating a light emitting display device according to an embodiment of the present disclosure, and FIG. 2 is a diagram illustrating the configuration of a sub-pixel illustrated in FIG. 1.

Referring to FIG. 1, the light emitting display device according to the embodiment of the present disclosure may include an image supply 110, a timing controller 120, a scan driver 130, a data driver 140, a display panel 150, and a power supply 180.

The image supply (or host system) 110 may output various driving signals together with an image data signal received from the outside or an image data signal stored in an internal memory. The image supply 110 may transmit the data signal and the various driving signals to the timing controller 120.

The timing controller 120 may output a gate timing control signal GDC for controlling the operation timing of the scan driver 130, a data timing control signal DDC for controlling the operation timing of the data driver 140, and various synchronization signals (a vertical synchronization signal Vsync and a horizontal synchronization signal Hsync). The timing controller 120 may transmit a data signal DATA received from the image supply 110 together with the data timing control signal DDC to the data driver 140. The timing controller 120 may be configured as an integrated circuit (IC) and mounted on a printed circuit board (PCB), which should not be construed as limiting the present disclosure.

The scan driver 130 may output a gate signal (or a gate voltage) in response to the gate timing control signal GDC received from the timing controller 120. The scan driver 130 may transmit the gate signal to sub-pixels included in the display panel 150 through gate lines GL1 to GLm. The scan driver 130 may be configured as an IC or may be formed directly on the display panel 150 in a gate-in-panel (GIP) manner, which should not be construed as limiting the present disclosure.

The data driver 140 may sample and latch the data signal DATA in response to the data timing control signal DDC received from the timing controller 120, and convert the digital data signal to an analog data voltage based on a gamma reference voltage. The data driver 140 may supply the data voltage to the sub-pixels included in the display panel 150 through data lines DL1 to DLn. The data driver 140 may be configured as an IC and mounted on the display panel 150 or may be mounted on a PCB, which should not be construed as limiting the present disclosure.

The power supply 180 may generate a high-potential voltage and a low-potential voltage based on an external input voltage received from the outside. The power supply 180 may output the high-potential voltage and the low-potential voltage through a first power line EVDD and a second power line EVSS. The power supply 180 may generate and output a voltage (e.g., a gate voltage including a gate high voltage and a gate low voltage) for driving the scan driver 130 or a voltage (e.g., a drain voltage including a drain voltage and a half drain voltage) for driving the data driver 140 as well as the high-potential voltage and the low-potential voltage.

The display panel 150 may display an image in correspondence with a driving signal including the gate signal and the data voltage, the high-potential voltage, and the low-potential voltage. The sub-pixels of the display panel 150 directly emit light. The display panel 150 may be manufactured based on a rigid or flexible substrate formed of a material such as glass, silicon, or polyimide. The sub-pixels that emit light may be red, green, and blue (RGB) sub-pixels or red, green, blue, and white (RGBW) sub-pixels, which form pixels.

The timing controller 120, the scan driver 130, and the data driver 140 have been described above as separate components. However, one or more of the timing controller 120, the scan driver 130, and the data driver 140 may be integrated into one IC depending on how the light emitting display device is implemented.

Referring to FIG. 2, one sub-pixel SP may include a switching transistor SW, a driving transistor DT, a sensing transistor ST, a capacitor CST, and an organic light emitting diode OLED.

The driving transistor DT may have a gate electrode connected to a first electrode of the capacitor CST, a first electrode connected to the first power line EVDD, and a second electrode connected to an anode electrode of the organic light emitting diode OLED. The capacitor CST may have the first electrode connected to the gate electrode of the driving transistor DT and a second electrode connected to the anode electrode of the organic light emitting diode OLED. The organic light emitting diode OLED may have the anode electrode connected to the second electrode of the driving transistor DT, and a cathode electrode connected to the second power line EVSS.

The switching transistor SW may have a gate electrode connected to a first scan line SCAN included in a first gate line GL1, a first electrode connected to a first data line DL1, and a second electrode connected to the gate electrode of the driving transistor DT. The sensing transistor ST may have a gate electrode connected to a first sense line SENSE included in the first gate line GL1, a first electrode connected to a first reference line REF1, and a second electrode connected to the anode electrode of the organic light emitting diode OLED.

The sensing transistor ST is a kind of compensation circuit added to compensate for deterioration (a threshold voltage or the like) of the driving transistor DT or the organic light emitting diode OLED. The sensing transistor ST may enable physical threshold voltage sensing based on a source follower operation of the driving transistor DT. The sensing transistor ST may operate to obtain a sensing voltage through a sensing node defined between the driving transistor DT and the organic light emitting diode OLED.

While the first gate line GL1 is shown as divided into the first scan line SCAN and the first sense line SENSE by way of example, the first scan line SCAN and the first sense line SENSE may be integrated into one line. That is, the switching transistor SW and the sensing transistor ST may be connected commonly to the first gate line GL1 and thus turned on or off at the same time.

For the sub-pixel SP, there may be complex and various circuits for a configuration for compensating for the deterioration of the driving transistor DT as well as the light emitting diode OLED that emits light. Accordingly, the configuration of the sub-pixel SP illustrated in FIG. 2 is merely an example, not limiting the present disclosure.

However, to help understanding of the present disclosure, the structure shown in FIG. 2 is taken as an example.

Figure 3:
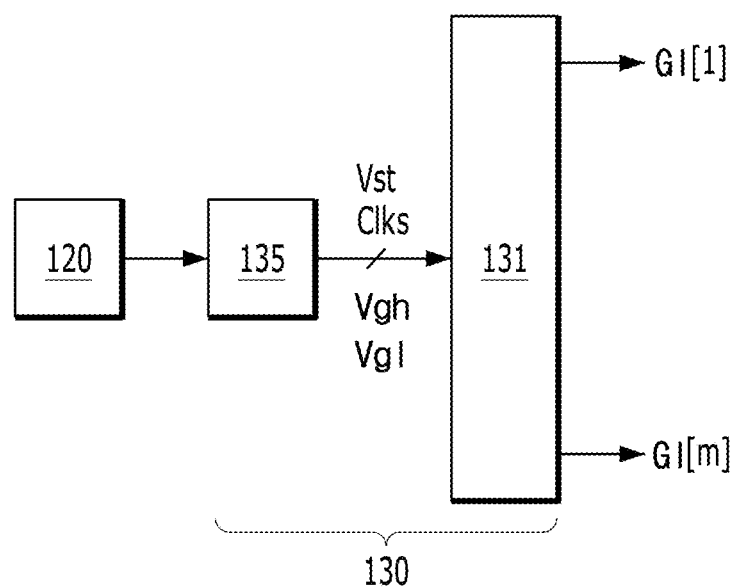
FIGS. 3, 4A, 4B, and 5 are diagrams illustrating the configuration of a gate-in-panel (GIP) scan driver and the configuration of a device related to the GIP scan driver.
Figure 4A:
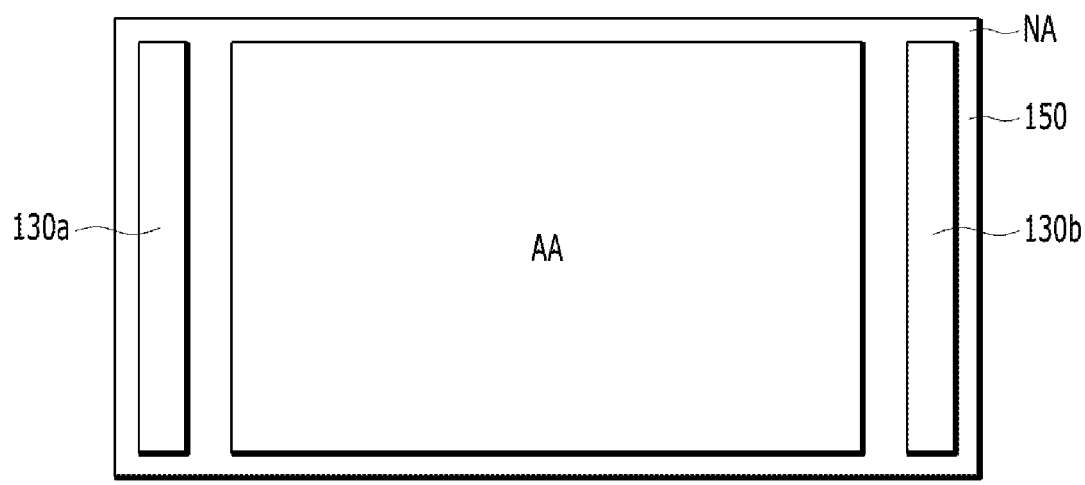
Figure 4B:
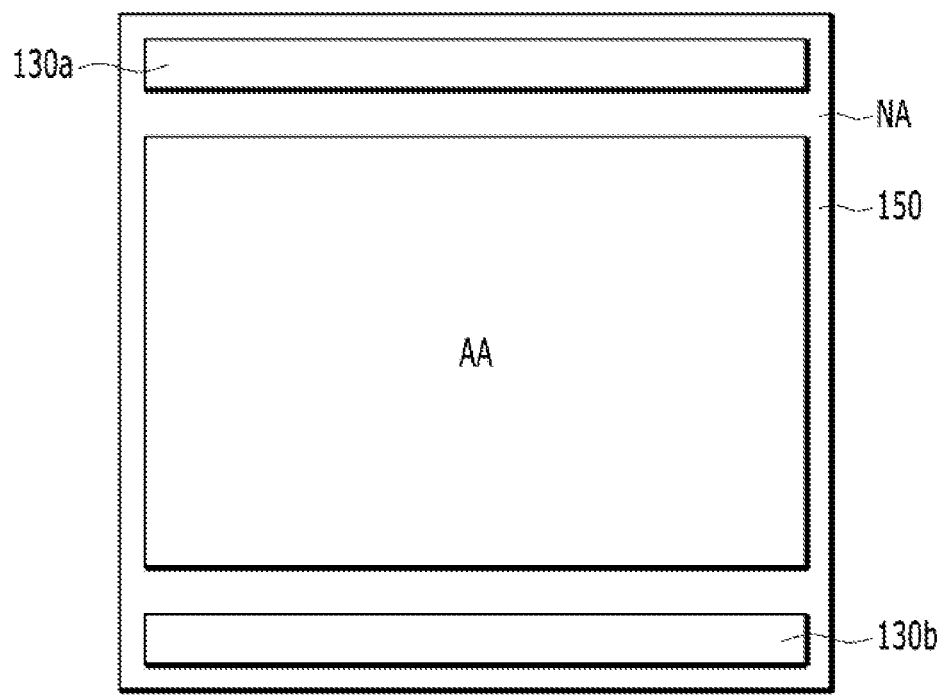
Figure 5:
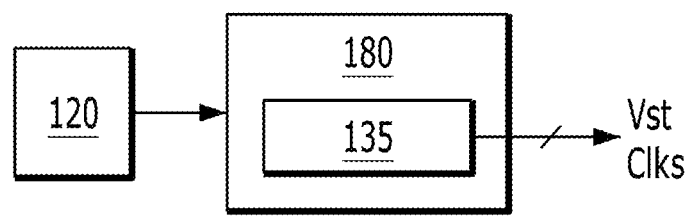

FIGS. 3 to 5 are diagrams illustrating the configuration of a gate-in-panel (GIP) scan driver and the configuration of a device related to the GIP scan driver.

Referring to FIG. 3, the GIP scan driver 130 may include a shift register 131 and a level shifter 135. The level shifter 135 may generate clock signals Clks, a start signal Vst, a gate high voltage Vgh, and a gate low voltage Vgl based on signals received from the timing controller 120. The clock signals Clks may be generated with K different phases (K is an integer equal to or greater than 2) such as 2 phases, 4 phases, or 8 phases.

The shift register 131 may operate based on the signals Clk and Vst and the voltages Vgh and Vgl received from the level shifter 135 and output gate signals G1[1] to G1[m] to turn on or off transistors formed on the display panel. The shift register 131 may be formed in the form of a thin film on the display panel.

Referring to FIGS. 4A and 4B, shift registers 131*a* and 131*b* may be formed in the form of thin films in the GIP manner and arranged in a non-display area NA of the display panel 150. Each of the shift registers 131*a* and 131*b* may include a transistor, a capacitor, and so on. As illustrated in FIG. 4A, the shift registers 131*a* and 131*b* may be disposed in left and right non-display areas NA of the display panel 150. As illustrated in FIG. 4B, the shift registers 131*a* and 131*b* may be disposed in upper and lower non-display areas NA of the display panel 150. Because the shift registers 131*a* and 131*b* are in the form of thin films, the shift registers 131*a* and 131*b* may be distributed inside a display area AA as well as the non-display areas NA.

Referring to FIG. 5, since the level shifter 135 is formed as an IC unlike the shift register 131, the level shifter 135 may be included in the power supply 180 according to the size, resolution, or device implementation method of the display panel. However, this is merely an example, not limiting the teachings of the present disclosure.

Figure 6:
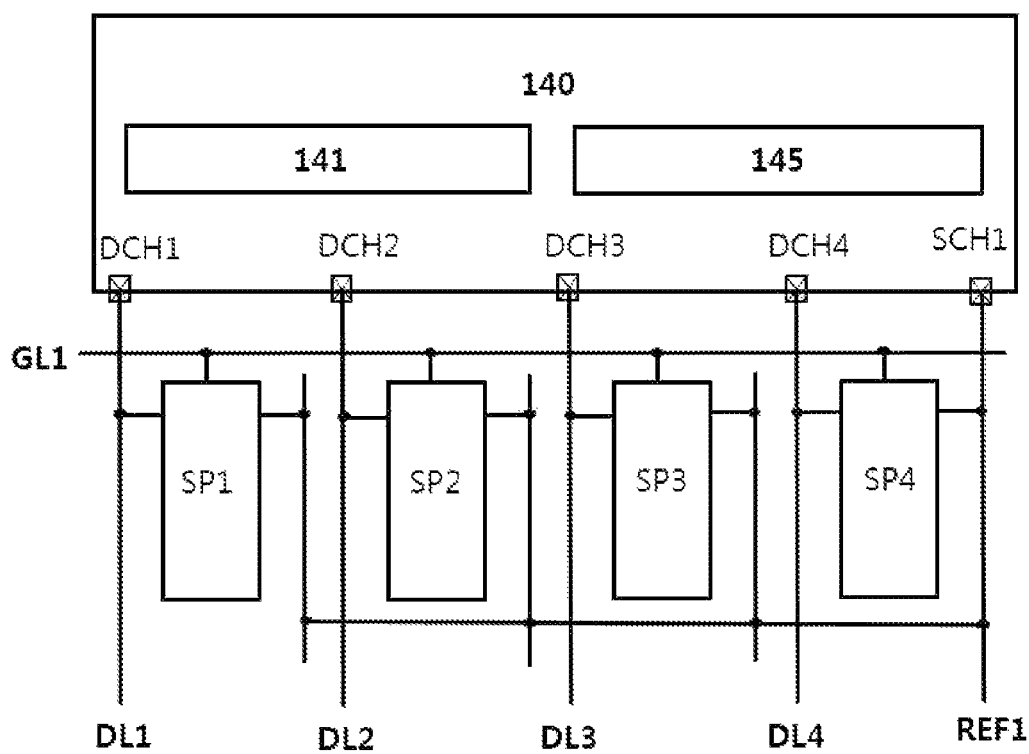
FIG. 6 is a block diagram illustrating a data driver and sub-pixels according to an embodiment of the present disclosure.

FIG. 6 is a block diagram illustrating a data driver and sub-pixels according to an embodiment of the present disclosure.

Referring to FIG. 6, the data driver 140 may include a driving circuit 141 for driving sub-pixels and a sensing circuit 145 for sensing the sub-pixels. The driving circuit 141 may output a data voltage for driving the sub-pixels through data channels DCH1 to DCH4. The sensing circuit 145 may obtain a sensing voltage sensed from the sub-pixels through a first sensing channel SCH1.

The first to fourth data channels DCH1 to DCH4 may be connected to first to fourth data lines DL1 to DL4, respectively. The first to fourth data lines DL1 to DL4 may be connected to first to fourth sub-pixels SP1 to SP4, respectively. The first sensing channel SCH1 may be connected to the first reference line REF1. The first reference line REF1 may be connected commonly to the first to fourth sub-pixels SP1 to SP4.

While the sensing circuit 145 is shown as implemented inside the data driver 140 by way of example, the sensing circuit 145 may be separately implemented outside the data driver 140. However, to help understanding of the present disclosure, the structure illustrated in FIG. 6 is taken as an example. In addition, the first to fourth sub-pixels SP1 to SP4 are described as sharing one reference line REF1 included in the data driver 140, by way of example. Accordingly, the data driver 140 may have the single sensing channel SCH1 and the four data channels DCH1 to DCH4 for the four sub-pixels SP1 to SP4 in total. However, the sensing channels and the data channels may be in a 1:1 relationship.

Figure 7:
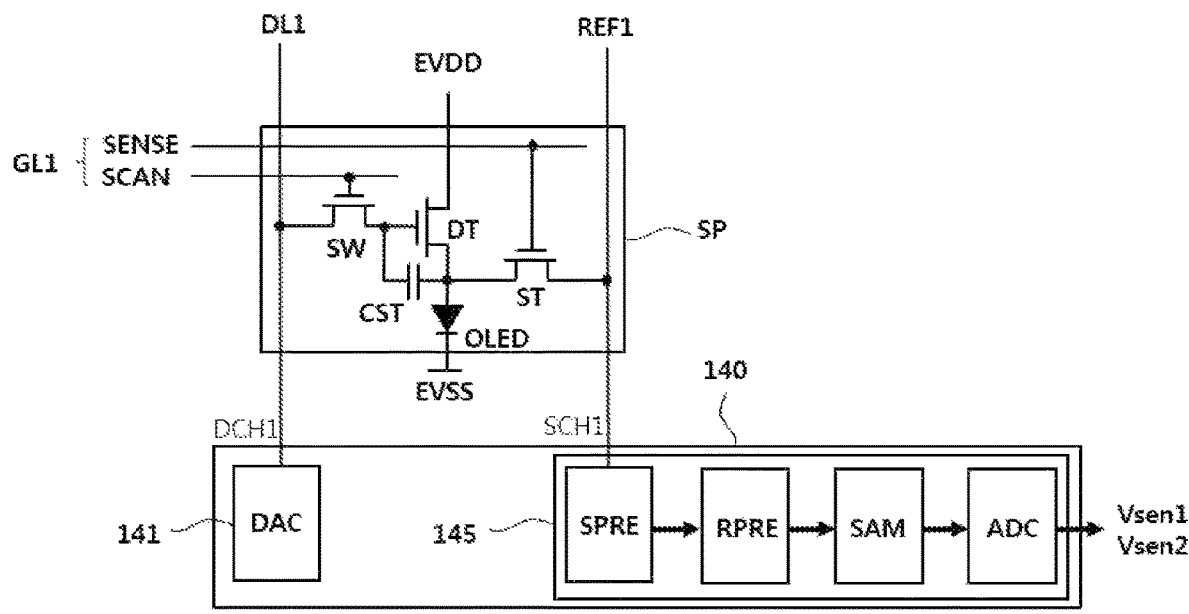
FIG. 7 is a diagram illustrating a sensing circuit according to a first embodiment of the present disclosure.
Figure 8:
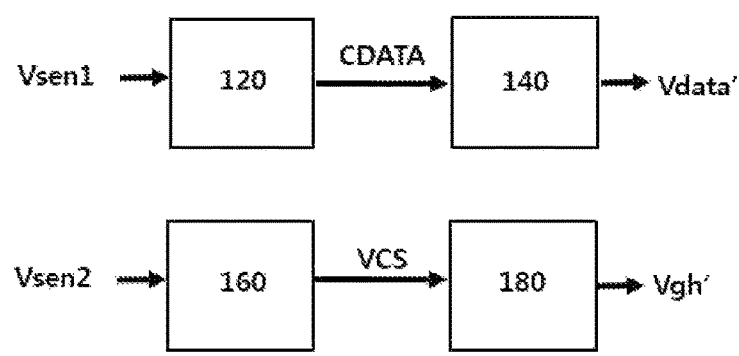
FIGS. 8 and 9 are diagrams illustrating the concept of compensation according to the first embodiment of the present disclosure.
Figure 9:
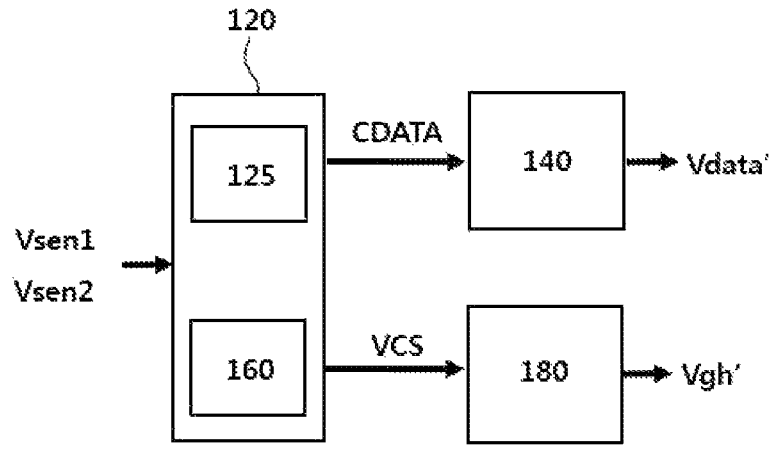

FIG. 7 is a diagram illustrating a sensing circuit according to a first embodiment of the present disclosure, and FIGS. 8 and 9 are diagrams illustrating the concept of compensation according to the first embodiment of the present disclosure.

Referring to in FIG. 7, the driving circuit 141 may include a digital-to-analog converter DAC. The digital-to-analog converter DAC may convert a digital data signal received from the timing controller into an analog data voltage to drive a sub-pixel. The data voltage generated by the digital-to-analog converter DAC may be output through the first data channel DCH1 of the data driver 140.

The sensing circuit 145 may include a first voltage circuit SPRE, a second voltage circuit RPRE, a sampling circuit SAM, and an analog-to-digital converter ADC. The first voltage circuit SPRE and the second voltage circuit RPRE may output a first reference voltage and a second reference voltage, respectively to initialize a node or circuit included in a sub-pixel. In some embodiments, the first reference voltage may be defined as a voltage used in a sensing mode, and the second reference voltage may be defined as a voltage used in a driving mode (normal mode). The first reference voltage may be set to be lower than the second reference voltage. The sampling circuit SAM may perform a sampling operation to obtain a sensing voltage through the first sensing channel SCH1. The analog-to-digital converter ADC may convert an analog sensing voltage obtained by the sampling circuit SAM into a digital sensing voltage.

The sensing circuit 145 may obtain a first sensing voltage Vsen1 for compensating for deterioration of the driving transistor DT or the organic light emitting diode OLED included in the sub-pixel SP through the first reference line REF1. Further, the sensing circuit 145 may obtain a second sensing voltage Vsen2 for compensating the shift register that applies a gate signal to the sub-pixel SP through the first reference line REF1.

Referring to FIGS. 7 and 8, the timing controller 120 may receive the first sensing voltage Vsen1 from the sensing circuit 145. The timing controller 120 may determine whether the driving transistor DT or the organic light emitting diode OLED included in the sub-pixel SP has been deteriorated based on the first sensing voltage Vsen1. The timing controller 120 may generate a compensated data signal CDATA to compensate for the deterioration of the driving transistor DT or the organic light emitting diode OLED. The data driver 140 may output a data voltage Vdata' compensated based on the compensated data signal CDATA received from the timing controller 120.

A gate voltage controller 160 may receive the second sensing voltage Vsen2 from the sensing circuit 145. The gate voltage controller 160 may determine whether the switching transistor SW or the sensing transistor ST included in the sub-pixel SP has been deteriorated (whether the driving capability of the switching transistor SW or the sensing transistor ST has been deteriorated) based on the second sensing voltage Vsen2. The gate voltage controller 160 may output a voltage control signal VCS to compensate for the deterioration of the switching transistor SW or the sensing transistor ST.

The power supply 180 may output a gate voltage Vgh' compensated based on the voltage control signal VCS received from the gate voltage controller 160. When the compensated gate voltage Vgh' is output from the power supply 180, the shift register may raise the level of the gate high voltage for turning on the switching transistor SW or the sensing transistor ST.

The shift register may output a gate signal including a scan signal and a sense signal based on the raised gate high voltage to overcome (compensate for) deterioration such as the decrease of the turn-on capability, switching capability, or driving capability of the switching transistor SW or the sensing transistor ST. The level of the gate high voltage may be gradually raised to solve the deterioration problem such as the decrease of the turn-on capability, switching capability, or driving capability of the switching transistor SW or the sensing transistor ST.

Referring to FIGS. 7 and 9, the timing controller 120 may include a data signal compensator 125 and the gate voltage controller 160. In some embodiments, the data signal compensator 125 may be defined as a first deterioration compensator, and the gate voltage controller 160 may be defined as a second deterioration compensator.

The data signal compensator 125 may generate the compensated data signal CDATA to compensate for the deterioration of the driving transistor DT or the organic light emitting diode OLED based on the first sensing voltage Vsen1 received from the sensing circuit 145. The gate voltage controller 160 may generate the voltage control signal VCS to compensate for the deterioration of the switching transistor SW or the sensing transistor ST included in the sub-pixel SP based on the second sensing voltage Vsen2 received from the sensing circuit 145.

As noted from the description of FIGS. 8 and 9, the gate voltage controller 160 that generates the voltage control signal VCS may be configured independently or incorporated in the timing controller 120.

Now, a description will be given of a method of obtaining a first sensing voltage from a sub-pixel and a method of compensating a data signal (data voltage) based on the first sensing voltage.

Figure 10:
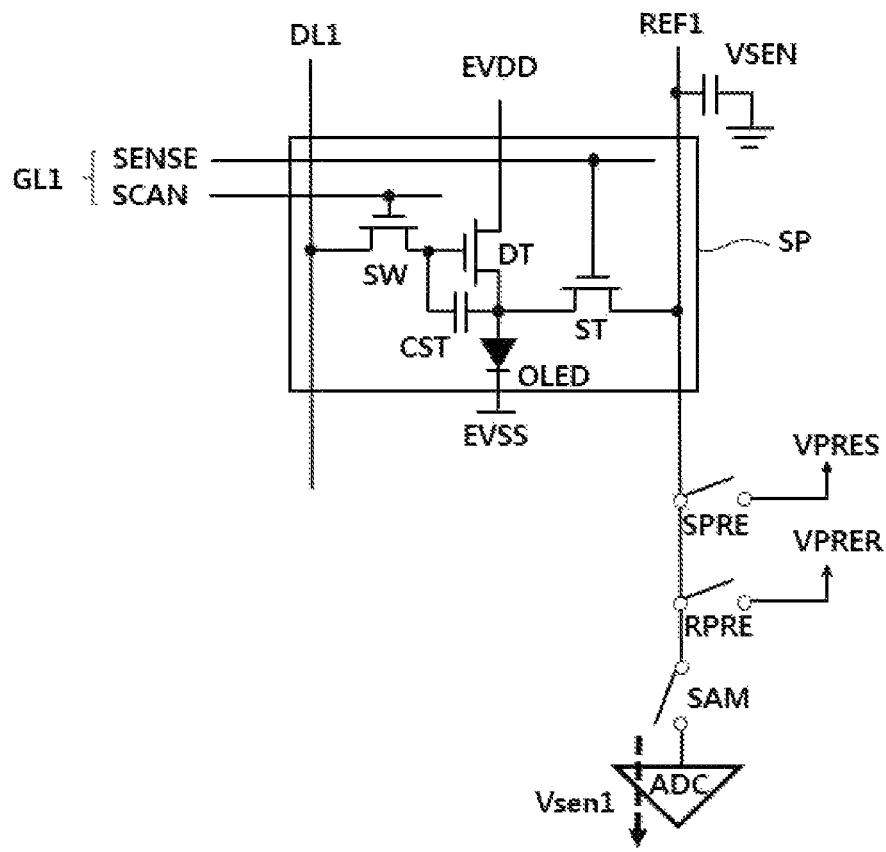
FIGS. 10 and 11 are diagrams illustrating a method of obtaining a first sensing voltage from a sub-pixel according to a second embodiment of the present disclosure.
Figure 11:
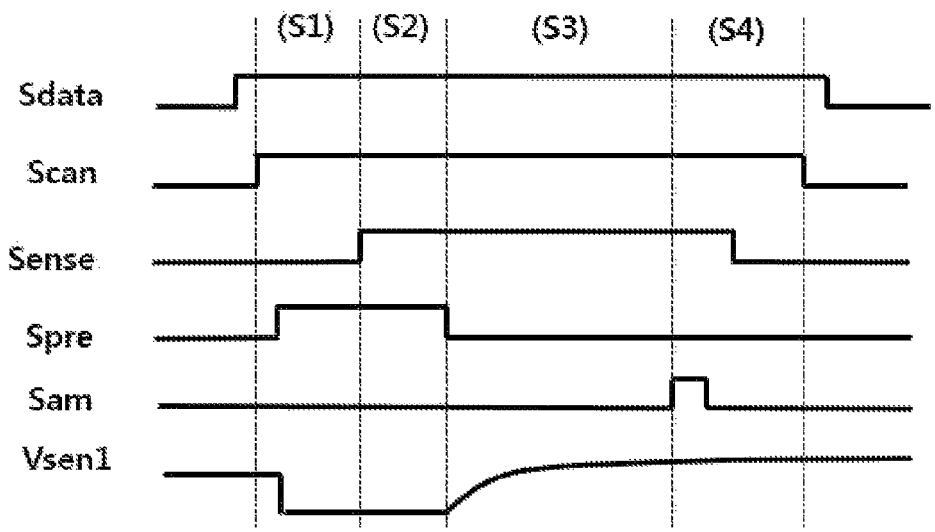

FIGS. 10 and 11 are diagrams illustrating a method of obtaining a first sensing voltage from a sub-pixel according to a second embodiment of the present disclosure.

Referring to FIGS. 10 and 11, the method of obtaining the first sensing voltage Vsen1 from the sub-pixel SP may include a first step S1, a second step S2, a third step S3, and a fourth step S4.

To obtain the first sensing voltage Vsen1 from the sub-pixel SP, a first sensing data voltage Sdata may be applied to the first data line DL1. The first sensing data voltage Sdata may be applied over an entire period spanning from the first step S1 to the fourth step S4, which should not be construed as limiting the present disclosure.

A scan signal Scan may be applied at logic high from the first step S1 to the fourth step S4. The switching transistor SW may maintain its turned-on state from the first step S1 to the fourth step S4 in response to the scan signal Scan.

A sense signal Sense may be applied at logic high from the second step S2 to the fourth step S4. The sensing transistor ST may maintain its turned-on state from the second step S2 to the fourth step S4 in response to the sense signal Sense.

A first voltage control signal Spre may be applied at logic high from the first step S1 to the second step S2. The first voltage circuit SPRE may output the first reference voltage from the first step S1 to the second step S2 in response to the first voltage control signal Spre. The first reference voltage output from the first voltage circuit SPRE may be transmitted through the first reference line REF1 and applied to the sensing node through the sensing transistor ST which is turned on during the sensing mode.

When the first reference voltage together with the first sensing data voltage Sdata is applied to the driving transistor DT, the driving transistor DT may perform a source follower operation. The first sensing voltage Vsen1 applied to the sensing node by the source follower operation of the driving transistor DT may be dropped to the level of the first reference voltage and then saturated. The first sensing voltage Vsen1 may be temporarily stored by being charged in a sensing capacitor VSEN (or line capacitor) of the first reference line REF1.

A sampling signal Sam may be applied at logic high during the fourth step S4. The sampling circuit SAM may be in the turned-on state during the fourth step S4 in response to the sampling signal Sam. The sampling circuit SAM is shown as being in the turned-on state temporarily at the beginning of the fourth step S4, which should not be construed as limiting the present disclosure.

The sampling circuit SAM may obtain the first sensing voltage Vsen1 saturated to a specific level during the fourth step S4. The difference between the first sensing data voltage Sdata and the saturated first sensing voltage Vsen1 may be a decision value based on which the degree of deterioration (variation of a threshold voltage) of the driving transistor DT may be determined.

The analog-to-digital converter ADC may convert an analog first sensing voltage Vsen1 sensed by the sampling circuit SAM into a digital first sensing voltage Vsen1 and then transmit the analog first sensing voltage Vsen1 to the timing controller. The timing controller may determine the degree of deterioration (variation of the threshold voltage) of the driving transistor DT based on the first sensing voltage Vsen1 and compensate the data signal. The data driver may output a data voltage compensated based on the compensated data signal.

A method of obtaining a second sensing voltage from a sub-pixel and a method of compensating a gate voltage based on the second sensing voltage will be described.

FIGS. 12 to 19 are diagrams illustrating a method of compensating a first gate high voltage after obtaining a second sensing voltage from a sub-pixel according to a second embodiment of the present disclosure.

Figure 12:
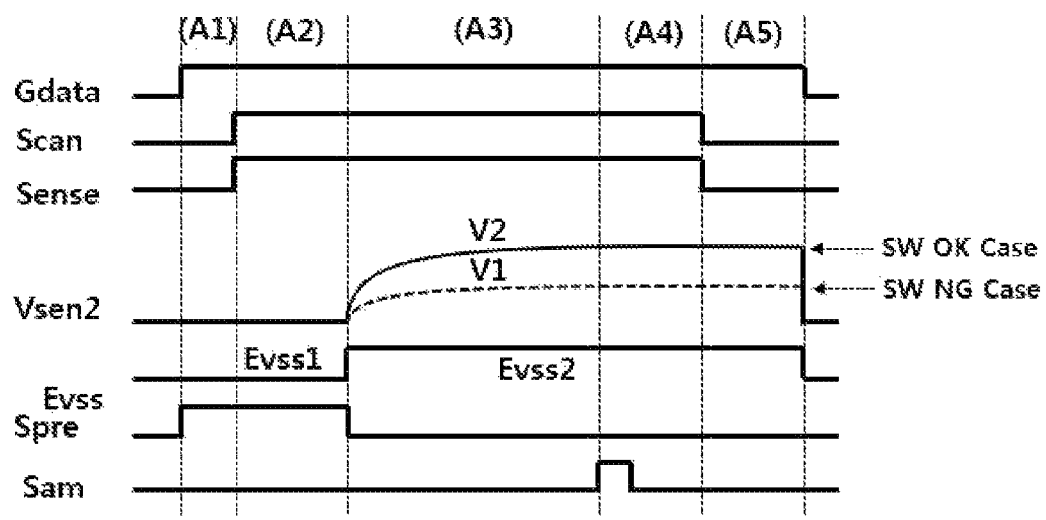
FIGS. 12 to 19 are diagrams illustrating a method of obtaining a second sensing voltage from a sub-pixel and then compensating a first gate high voltage according to the second embodiment of the present disclosure.

Referring to FIG. 12, the method of obtaining the second sensing voltage Vsen2 from the sub-pixel SP to compensate the first gate high voltage may include a first initialization step A1, a first programming step A2, a first sensing step A3, a first sampling step (A4), and a first sensing voltage output step A5.

To obtain the second sensing voltage Vsen2 from the sub-pixel SP, a second sensing data voltage Gdata may be applied to the first data line DL1. The second sensing data voltage Gdata may be applied over a total period spanning from the first initialization step A1 to the first sensing voltage output step A5, which should not be construed as limiting the present disclosure. The second sensing data voltage Gdata may have a different level from the first sensing data voltage Sdata.

The scan signal Scan may be applied at logic high from the programming step A2 to the first sensing voltage output step A4. The sense signal Sense may be applied at logic high from the first programming step A2 to the sampling step A4. The first voltage control signal Spre may be applied at logic high from the first initialization step A1 to the first programming step A2. The sampling signal Sam may be temporarily applied at logic high during the first sampling step A4.

Figure 13:
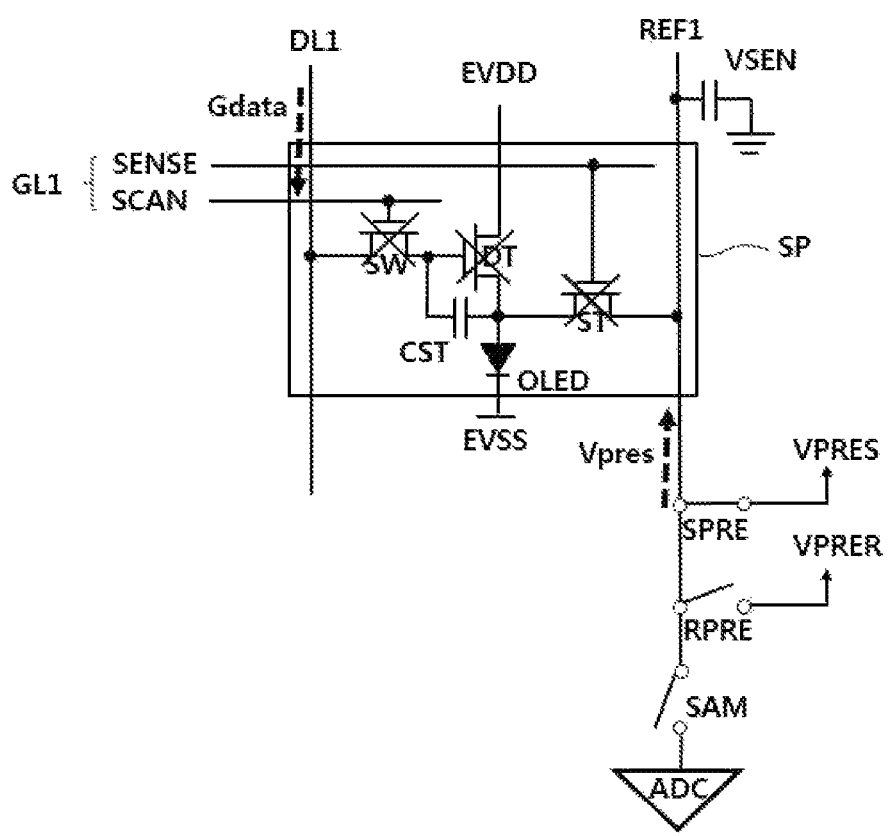

Referring to FIGS. 12 and 13, the second sensing data voltage Gdata may be applied to the first data line DL1 during the first initialization step A1, and a first reference voltage Vpres may be applied to the first reference line REF1. Accordingly, the switching transistor SW, the driving transistor DT, and the sensing transistor ST may be turned off. The first voltage circuit SPRE may output the first reference voltage Vpres in response to the first voltage control signal Spre. A first low-potential voltage Evss1 may be applied to the second power line EVSS. The first low-potential voltage Evss1 may be selected at a level used for operating the sub-pixel SP in the driving mode.

Figure 14:
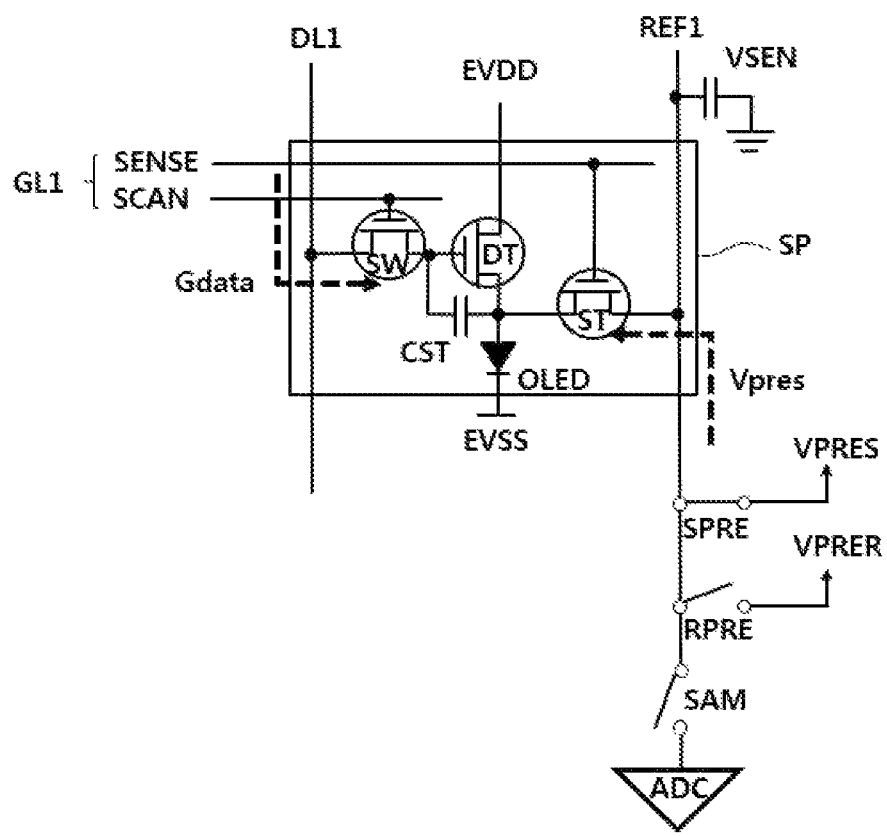

Referring to FIGS. 12 and 14, the second sensing data voltage Gdata applied to the first data line DL1 during the first programming step A2 may be applied to the gate electrode node of the driving transistor DT through the turned-on switching transistor SW. The first reference voltage Vpres applied to the first reference line REF1 may be applied to the source electrode node of the driving transistor DT through the turned-on sensing transistor ST. Accordingly, a voltage provided as the second sensing data voltage Gdata and the first reference voltage Vpres (a Gdata-Vpres voltage that may turn on the driving transistor) may be programmed to the capacitor CST. Accordingly, the switching transistor SW, the driving transistor DT, and the sensing transistor ST may be turned on. The first voltage circuit SPRE may maintain the output of the first reference voltage Vpres, and the first low-potential voltage Evss1 applied to the second power line EVSS may also be maintained.

Figure 15:
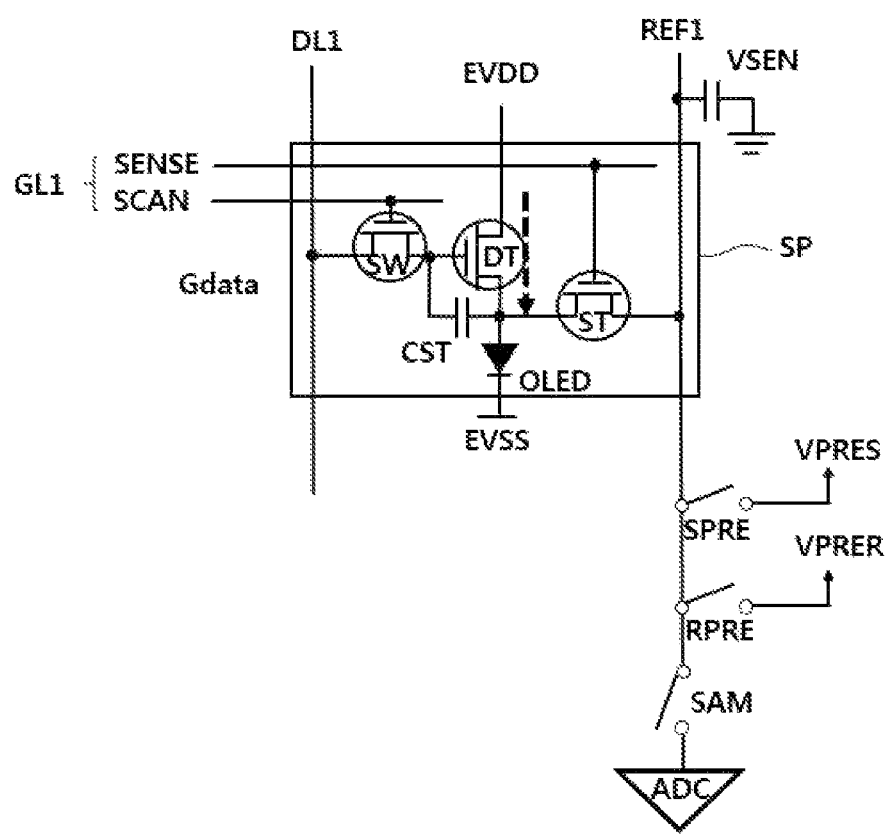

Referring to FIGS. 12 and 15, the second sensing voltage Vsen2 applied to the sensing node of the driving transistor DT during the first sensing step A3 may be in the form of a first voltage V1 or a second voltage V2 and may rise higher than the first reference voltage Vpres. Accordingly, the switching transistor SW, the driving transistor DT, and the sensing transistor ST may be maintained in the turned-on state. The first voltage circuit SPRE may block the output of the first reference voltage Vpres, and a second low-potential voltage Evss2 higher than the first low-potential voltage Evss1 may be applied to the second power line EVSS.

The second low-potential voltage Evss2 may be selected at a level higher than the level of the first low-potential voltage Evss1, used for operating the sub-pixel SP in the sensing mode. Accordingly, although the driving transistor DT may perform the source follower operation, the source follower operation may be affected by the second low-potential voltage Evss2 applied to the second power line EVSS. The second sensing voltage Vsen2 applied to the sensing node of the driving transistor DT may be maintained without being discharged through the second power line EVSS under the action of the second low-potential voltage Evss2 applied to the second power line EVSS. Further, the second sensing voltage Vsen2 applied to the sensing node of the driving transistor DT may be in the form of the first voltage V1 or the second voltage V2 and rise higher than the first reference voltage Vpres in correspondence with the turn-on capability of the switching transistor SW.

Figure 16:
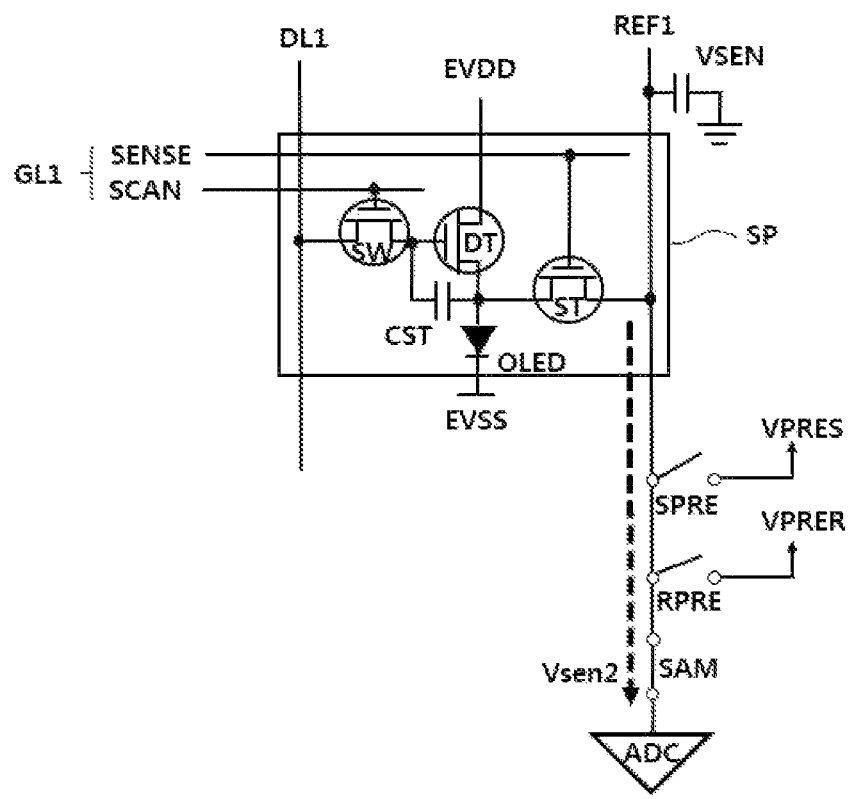

Referring to FIGS. 12 and 16, the second sensing voltage Vsen2 may be obtained during the first sampling step A4. Accordingly, the switching transistor SW, the driving transistor DT, and the sensing transistor ST may be maintained in the turned-on state. The first voltage circuit SPRE may continue to block the output of the first reference voltage Vpres, and the second low-potential voltage Evss2 applied to the second power line EVSS may be maintained. The sampling circuit SAM may obtain the second sensing voltage Vsen2 in response to the sampling signal Sam. The second sensing voltage Vsen2 may also be temporarily stored by being charged in the sensing capacitor VSEN (or line capacitor) of the first reference line REF1.

Figure 17:
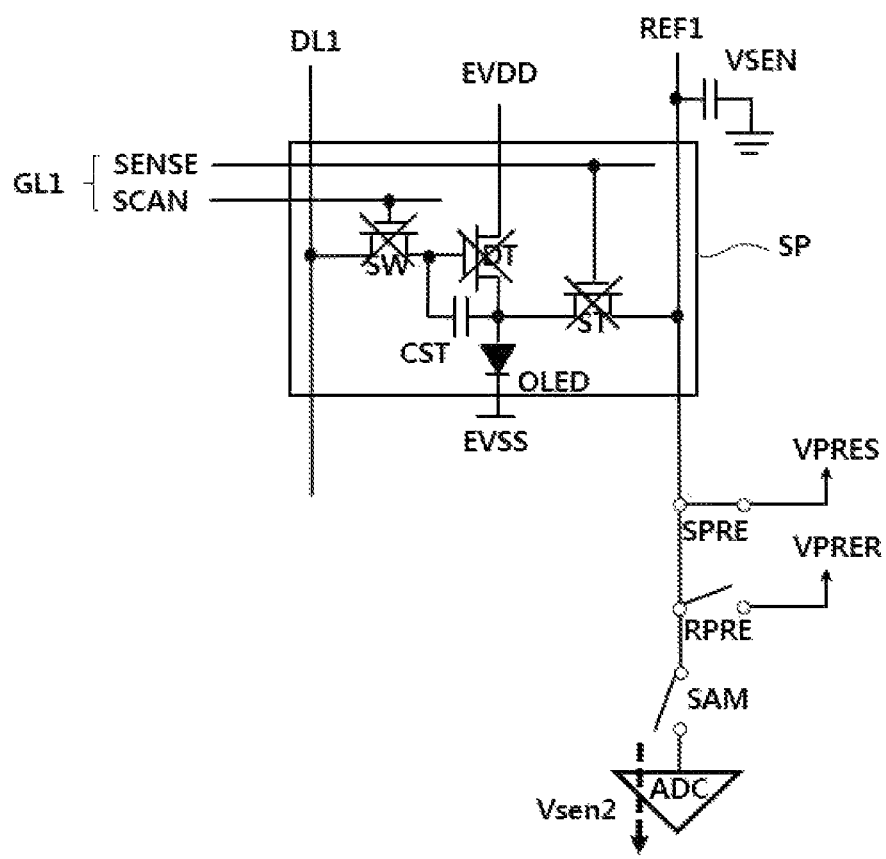
Figure 18:
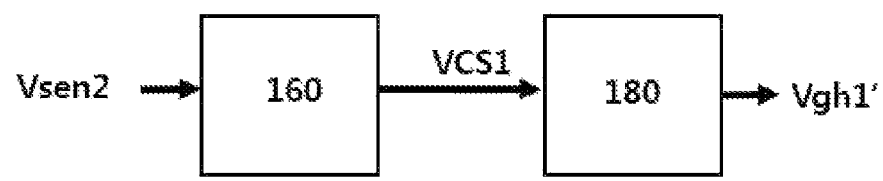
Figure 19:
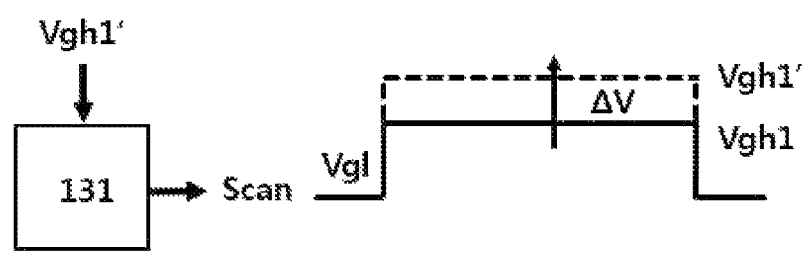

Referring to FIGS. 12 and 17, the second sensing voltage Vsen2 may be output to the outside of the data driver during the first sensing voltage output step A5. Accordingly, the analog-to-digital converter ADC may convert an analog second sensing voltage Vsen2 into a digital second sensing voltage Vsen2.

Referring to FIGS. 12 to 19, the gate voltage controller 160 may determine whether the switching transistor SW included in the sub-pixel SP has been deteriorated based on the second sensing voltage Vsen2. When the second voltage V2 is sensed as the second sensing voltage Vsen2, this implies that the switching transistor SW is operating normally (SW OK Case).

In contrast, when the first voltage V1 is sensed as the second sensing voltage Vsen2, this implies that the switching transistor SW is operating abnormally (SW NG Case). In some embodiments, the second voltage V2 may be defined as a range of the first reference voltage based on which it is determined whether the switching transistor SW has been deteriorated.

When the switching transistor SW is deteriorated, the switching transistor SW does not serve as a normal switch (on/off), and thus a second data voltage lower than the first data voltage may be applied to the gate electrode of the driving transistor DT (for example, when the switching transistor SW is deteriorated, only a data voltage of 4.8V is switched to the gate electrode of the driving transistor DT, instead of a target data voltage of 5V). In this case, the gate source voltage Vgs of the driving transistor DT may be dropped and lower current may flow. As a result, the second sensing voltage Vsen2 may also be detected as low (the reason that the second sensing voltage Vsen2 is dropped is that current flows through the driving transistor only when the gate source voltage Vgs is higher than a threshold Vth).

Accordingly, when the switching transistor SW is deteriorated and operates abnormally, the second sensing voltage Vsen2 may be detected at a lower level than during the normal operation. The range of the first reference voltage based on which it is determined whether the switching transistor SW is deteriorated may vary depending on the on/off characteristics of the switching transistor SW or the voltage (e.g., Vgh1) of the scan signal Scan. Accordingly, the range of the first reference voltage may be set empirically.

As described above, the gate voltage controller 160 may determine whether the switching transistor SW is in the normal state or the deteriorated state by analyzing the level of the second sensing voltage Vsen2. Further, the gate voltage controller 160 may determine the degree of deterioration of the switching transistor SW according to how much lower the level of the second sensing voltage Vsen2 is sensed than that of the second voltage V2. The gate voltage controller 160 may output the first voltage control signal VCS1 in correspondence with the degree of the deterioration of the switching transistor SW.

The power supply 180 may compensate the gate high voltage used for the scan signal Scan based on the first voltage control signal VCS1 received from the gate voltage controller 160 and output the compensated first gate high voltage Vgh1'. The shift register 131 may compensate the scan signal Scan for driving the switching transistor SW, based on the compensated first gate high voltage Vgh1'. After the compensation, the level of the first gate high voltage Vgh1' may be higher than the level of the first gate high voltage Vgh1 before compensation by ΔV. ΔV may vary according to the degree of the deterioration of the switching transistor SW.

Figure 20:
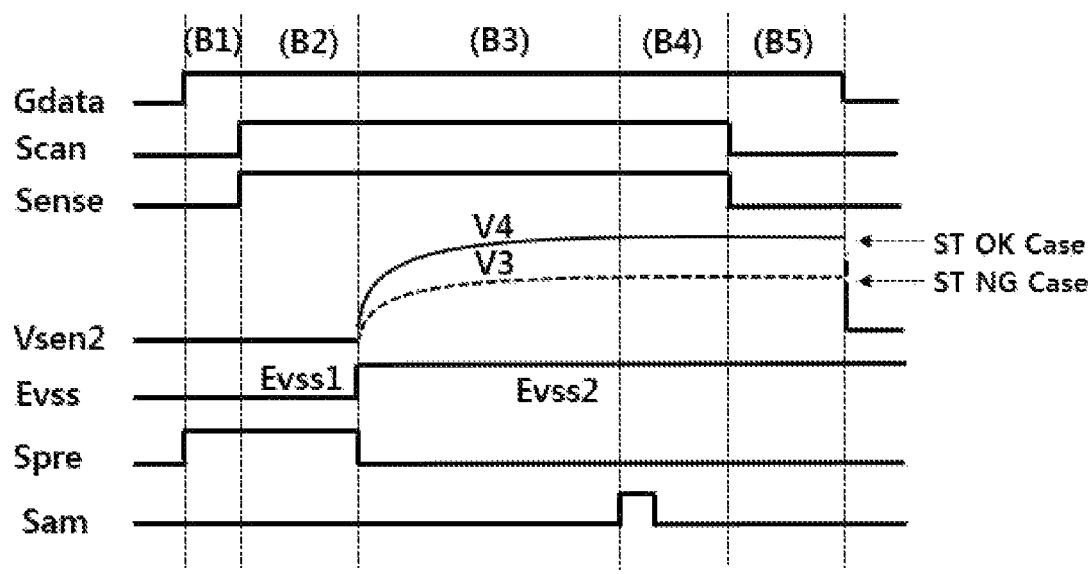
FIGS. 20, 21 and 22 are diagrams illustrating a method of obtaining a second sensing voltage from a sub-pixel and then compensating a second gate high voltage according to the second embodiment of the present disclosure.
Figure 21:
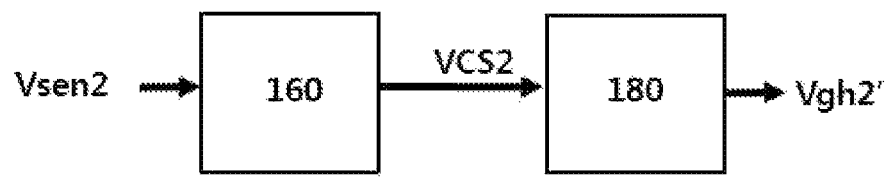
Figure 22:
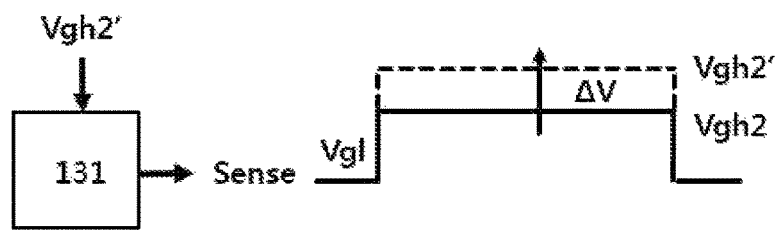

FIGS. 20, 21 and 22 are diagrams illustrating a method of compensating a second gate high voltage after obtaining a second sensing voltage from a sub-pixel according to a second embodiment of the present disclosure.

Referring to FIGS. 20, 21 and 22, the method of obtaining the second sensing voltage Vsen2 from the sub-pixel SP to compensate the second gate high voltage may include a second initialization step B1, a second programming step B2, a second sensing step B3, a second sampling step B4, and a second sensing voltage output step B5.

As noted from a comparison between FIGS. 12 and 20, the sensing method for compensating the first gate high voltage and the sensing method for compensating the second gate high voltage may be performed in the same steps (the same order) under the same conditions. Therefore, for a related description, refer to FIGS. 12 to 17.

The gate voltage controller 160 may determine whether the sensing transistor ST included in the sub-pixel SP has been deteriorated based on the second sensing voltage Vsen2. When a fourth voltage V4 is sensed as the second sensing voltage Vsen2, this implies that the sensing transistor ST is operating normally (ST OK Case). In contrast, when a third voltage V3 is sensed as the second sensing voltage Vsen2, this implies that the sensing transistor ST is operating abnormally (ST NG Case). In some embodiments, the fourth voltage V4 may be defined as a range of the second reference voltage based on which it is determined whether the switching transistor SW has been deteriorated.

Similarly to the case in which the switching transistor SW is deteriorated and thus operates abnormally, when the sensing transistor ST is deteriorated, the second sensing voltage Vsen2 may be detected at a lower level than during the normal operation. The range of the second reference voltage based on which it is determined whether the sensing transistor ST is deteriorated may vary depending on the on/off characteristics of the sensing transistor ST or the voltage (e.g., Vgh2) of the scan signal. Accordingly, the range of the second reference voltage may be set empirically.

As described above, the gate voltage controller 160 may determine whether the sensing transistor ST is in the normal state or the deteriorated state by analyzing the level of the second sensing voltage Vsen2. Further, the gate voltage controller 160 may determine the degree of deterioration of the sensing transistor ST according to how much lower the level of the second sensing voltage Vsen2 is sensed than that of the fourth voltage V4. The gate voltage controller 160 may output the second voltage control signal VCS2 in correspondence with the degree of the deterioration of the sensing transistor ST.

The power supply 180 may compensate the gate high voltage used for the sense signal Sense based on the second voltage control signal VCS2 received from the gate voltage controller 160 and output the compensated second gate high voltage Vgh2'. The shift register 131 may compensate the sense signal Sense for driving the sensing transistor ST, based on the compensated second gate high voltage Vgh2'. After the compensation, the level of the second gate high voltage Vgh2' may be higher than the level of the second gate high voltage Vgh2 before the compensation by ΔV. ΔV may vary according to the degree of the deterioration of the sensing transistor ST.

In the second embodiment, the determination of deterioration or non-deterioration based on analysis of the level of the second sensing voltage Vsen2 and the compensation for deterioration may be performed individually for the switching transistor SW and the sensing transistor ST (individual evaluation & individual compensation).

However, the ranges of the reference voltages based on which deterioration is determined and the variable voltage ranges for compensating for the deterioration may vary depending on manufacturers. Therefore, in the above description, the second voltage V2 based on which it is determined whether the switching transistor SW is deteriorated, and the fourth voltage V4 based on which it is determined whether the sensing transistor ST is deteriorated should be understood as implying that when the level of a voltage is changed from its previous level in a certain way, deterioration may be determined. When both the switching transistor SW and the sensing transistor ST have been deteriorated, the second sensing voltage Vsen2 may be detected at a level lower than the first voltage V1 or the third voltage V3.

The compensation of the first and second gate high voltages Vgh1 and Vgh2 used to drive the switching transistor SW and the sensing transistor ST may be based on the data driver 140, the gate voltage controller 160, the power supply 180, and the shift register 131. Accordingly, a circuit (compensator) for compensating the first and second gate high voltages Vgh1 and Vgh2 may include a plurality of devices (or units) instead of one device (or unit).

Figure 23:
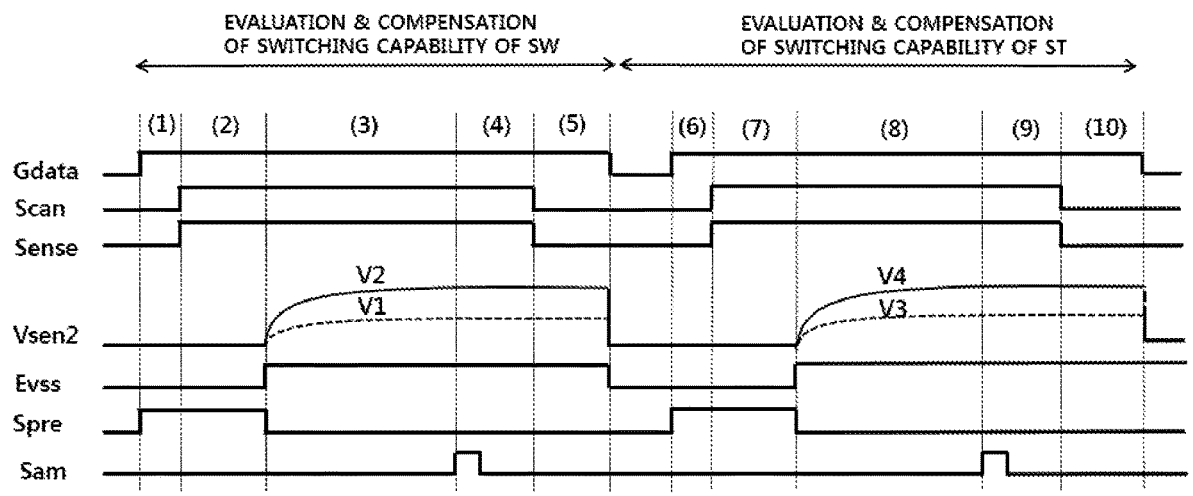
FIGS. 23 and 24 are diagrams illustrating a method of successively sensing first and second gate high voltages and compensating the first and second gate high voltages according to the second embodiment of the present disclosure.
Figure 24:
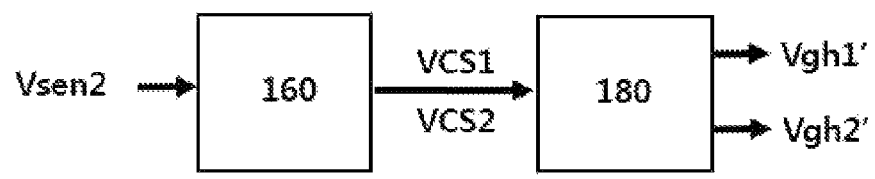

FIGS. 23 and 24 are diagrams illustrating a method of successively sensing and compensating first and second gate high voltages according to the second embodiment of the present disclosure.

Referring to FIGS. 7 and 23, when the second sensing voltage Vsen2 is obtained from the sub-pixel SP, it may be determined whether the switching transistor SW or the sensing transistor ST has been deteriorated, and the deterioration may be compensated for. As noted from to a first step (1) to a fifth step (5) and a sixth step (6) to a tenth step (10), the steps of obtaining the second sensing voltage Vsen2 from the sub-pixel SP are substantially identical.

Accordingly, the sensing process for determining whether the switching transistor SW and the sensing transistor ST have been deteriorated and the compensation process may be successively performed, as shown in the first step (1) to the tenth step (10).

The gate voltage controller 160 may sequentially analyze the level of the second sensing voltage Vsen2 and output the first voltage control signal VCS1 and the second voltage control signal VCS2. The power supply 180 may simultaneously output the compensated first gate high voltage Vgh1' for compensating for the deterioration of the switching transistor SW and the compensated second gate high voltage Vgh2' for compensating for the deterioration of the sensing transistor St, in correspondence with the first voltage control signal VCS1. As a result, when both the switching transistor SW and the sensing transistor ST included in the sub-pixel SP are deteriorated, they may be simultaneously compensated, thereby increasing driving reliability.

To obtain desired or selected driving capability, the gate voltage controller 160 may repeat, at least twice, the sensing process for determining whether the switching transistor SW and the sensing transistor ST are deteriorated and the compensation process, and change the first and second gate high voltages Vgh1' and Vgh2'. As a result, since the driving capability of the switching transistor SW and the sensing transistor ST included in the sub-pixel SP are relatively accurately and uniformly compensated, the driving stability and reliability may be further improved.

Figure 25:
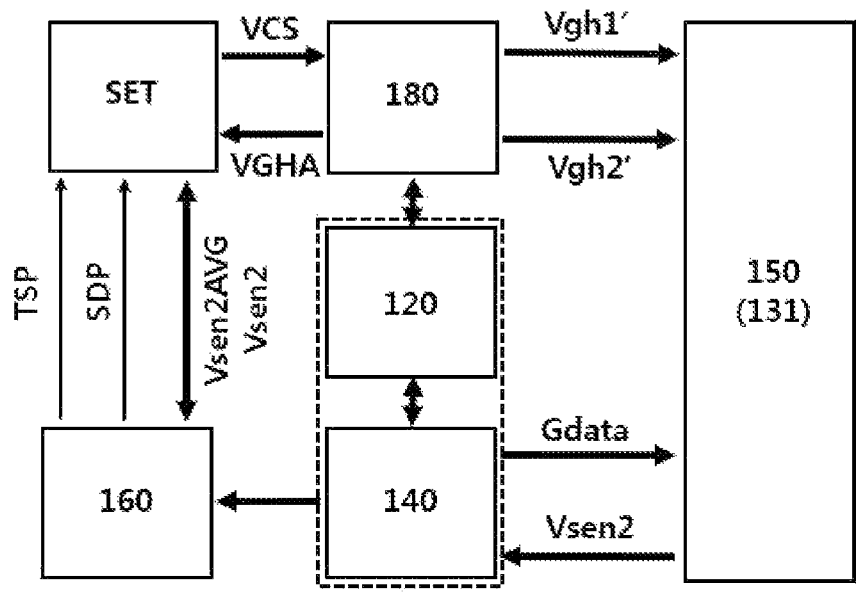
FIG. 25 is a diagram illustrating an implementation example of a light emitting display device for compensating a gate voltage according to a third embodiment of the present disclosure.
Figure 26:
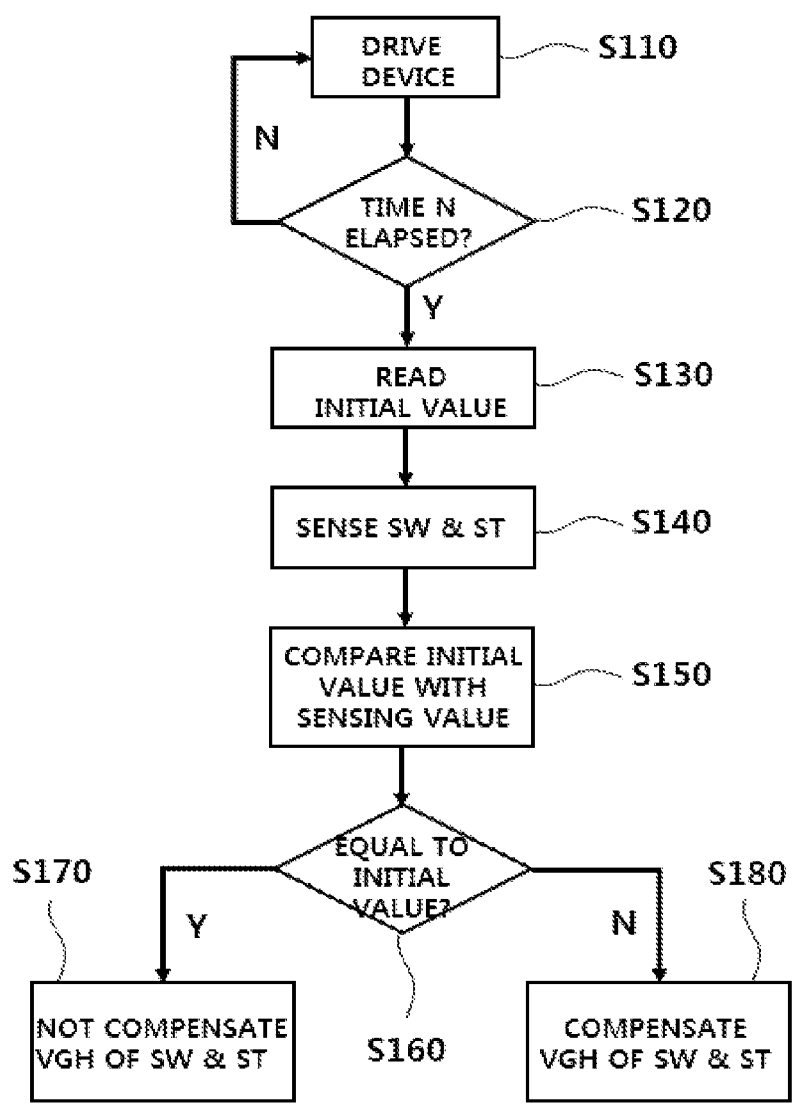
FIG. 26 is a flowchart illustrating a method of compensating a gate voltage in the light emitting display device illustrated in FIG. 25.

FIG. 25 is a diagram illustrating an implementation example of a light emitting display device that compensates a gate voltage according to a third embodiment of the present disclosure, and FIG. 26 is a flowchart illustrating a method of compensating a gate voltage in the light emitting display device illustrated in FIG. 25.

Referring to FIGS. 25 and 26, the light emitting display device may include a main set SET, the power supply 180, the timing controller 120, the data driver 140, the gate voltage controller 160, and the display panel 150 with the shift register 131 built therein. The timing controller 120 and the data driver 140 may be integrated into one device according to the resolution, size, or implementation scheme of the display panel 150.

As described before in the second embodiment, the data driver 140 may obtain the second sensing voltage Vsen2 based on the second sensing data voltage Gdata, digitize the second sensing voltage Vsen2, and transmit the digital second sensing voltage Vsen2 to the gate voltage controller 160.

The gate voltage controller 160 may repeatedly obtain the second sensing voltage Vsen2, calculate an average value Vsen2AVG of the levels of the second sensing voltage Vsen2, and transmit the average value Vsen2AVG to the main set SET (or the timing controller).

The main set SET may set a condition for an initial normal state (an initial sensing value/initial value obtained through initial driving) based on the average value Vsen2AVG of the levels of the second sensing voltage Vsen2. The main set SET may store the average value Vsen2AVG of the levels of the second sensing voltage Vsen2 calculated in the initial normal state in a memory included in the power supply 180 (or in a memory included in the main set SET).

A system of a first interface (e.g., I2C) for exchanging the average value Vsen2AVG or the second sensing voltage Vsen2 and a second interface (e.g., Vbyone) for transmitting a sensing start notification TSP or a sensing completion notification SDP may reside between the main set SET and the gate voltage controller 160. In addition, a first interface (e.g., I2C) system for reading or writing the voltage control signal VCS and the gate high voltage VGHA may reside between the main set SET and the power supply 180, to which the present disclosure is not limited.

When the light emitting display device is shipped, the main set SET may perform a compensation operation in conjunction with the gate voltage controller 160 and the power supply 180 in each preset time interval before the shipment or in each user-set time interval. The compensation operation will be described below.

The main set SET may drive the light emitting display device (S110) and determine whether a time N has elapsed (S120). N may be a time set before shipment or a time set by a user. When the time N has not elapsed after the light emitting display device is driven (N), the device is continuously driven. When the time N has elapsed after the light emitting display device is driven (Y), the main set SET may read the initial value stored in the memory as the driving condition of the initial normal state (S130).

The main set SET may control the timing controller 120 and the data driver 140 and obtain the second sensing voltage Vsen2, to sense the switching transistor SW and the sensing transistor ST (S140). The main set SET may compare the initial value with the second sensing voltage Vsen2, which is a sensing value obtained by the sensing, and determine whether there is a change in the initial value (S150).

When the level of the second sensing voltage Vsen2 is equal to the initial value (S160_Y), the main set SET may not compensate the switching transistor SW and the sensing transistor ST (S170). On the contrary, when the level of the second sensing voltage Vsen2 is different from the initial value (S160_N), the main set SET may compensate at least one of the switching transistor SW or the sensing transistor ST (S180). It may be determined whether the difference between the sensing value and the initial value is within an allowed range rather than whether the initial value and the sensing value are exactly equal. Only when the difference is outside the allowed range, step S180 may be performed.

As the above description is based on an example in which the switching transistor SW and the sensing transistor ST are implemented as n-type thin film transistors, change of the level of the gate high voltage has been taken as an example. However, when the switching transistor SW and the sensing transistor ST are implemented in p-type thin film transistors, change of the level of the gate low voltage may be described in the above description. That is, the present disclosure should be understood as a concept and configuration for changing a gate voltage in correspondence with the driving capability or deterioration or non-deterioration of transistors included in a sub-pixel.

As is apparent from the foregoing description, the teachings of the present disclosure has an effect of evaluating and compensating the driving capability or deterioration of a switching transistor, a sensing transistor, and a driving transistor included in a sub-pixel. Further, the present disclosure has an effect of increasing the possibility of restoration of driving capability by evaluating deterioration of the switching transistor and the sensing transistor, respectively, and performing accurate and uniform compensation for each of the switching transistor and the sensing transistor. Further, since determination of deterioration or non-deterioration and compensation for the deterioration are performed individually for the switching transistor and the sensing transistor, the present disclosure may increase the driving stability and reliability of the device as well as the lifetime of the device.

Although the one or more embodiments of the present disclosure have been disclosed for illustrative purposes, those skilled in the art will appreciate that various modifications, additions and substitutions are possible, without departing from the scope and spirit of the disclosure as disclosed in the accompanying claims.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
   a display panel, including a sub-pixel, for displaying an image;
   a data line coupled to the sub-pixel;
   a gate line coupled to the sub-pixel;
   a reference line coupled to the sub-pixel;
   a data driver configured to apply a data voltage to the data line of the sub-pixel;
   a scan driver configured to apply a gate signal to the gate line of the sub-pixel;
   a power supply; and
   a sensing circuit coupled to the sub-pixel, the sensing circuit including a first voltage circuit and a second voltage circuit, the first and second voltage circuits coupled to the reference line, the first voltage circuit configured to output a first reference voltage during a sensing mode and the second voltage circuit configured to output a second reference voltage for a driving mode,
   wherein a gate voltage of the gate signal is compensated based on a sensing voltage sensed from the sub-pixel,
   wherein the first reference voltage is lower than the second reference voltage,
   wherein the sensing mode includes obtaining a first sensing voltage to compensate for the deterioration of at least one of a driving transistor and a light emitting diode of the sub-pixel, and obtaining a second sensing voltage to compensate for the deterioration of at least one of a switching transistor and a sensing transistor of the sub-pixel,
   wherein the second sensing voltage is repeatedly sensed and prepared as an average value, and
   wherein an initial normal state of the switching transistor and the sensing transistor is set based on the average value, and the average value prepared in the initial normal state is stored in a memory.

2. The display device according to claim 1, wherein a level of the gate voltage for turning on at least one of the switching transistor and the sensing transistor included in the sub-pixel is changed based on the sensing voltage sensed from the sub-pixel.

3. The display device according to claim 2, wherein the level of the gate voltage is raised in correspondence with a decrease in the driving capability of at least one of the switching transistor and the sensing transistor.

4. The display device according to claim 1, wherein a compensator for compensating the gate voltage comprises:
   the sensing circuit configured to obtain the sensing voltage sensed from the sub-pixel;
   a voltage controller configured to output a voltage control signal for changing the gate voltage based on the sensing voltage received from the sensing circuit; and
   a shift register configured to receive the compensated gate voltage from the power supply and output a gate signal compensated based on the compensated gate voltage,
   wherein the power supply is configured to compensate the gate voltage in response to the voltage control signal and outputting the compensated gate voltage.

5. The display device according to claim 4, wherein the shift register is configured to:
   receive a compensated first gate voltage from the power supply and output a scan signal for turning on the switching transistor based on the compensated first gate voltage; and
   receive a compensated second gate voltage from the power supply and output a sense signal for turning on the sensing transistor based on the compensated second gate voltage.

6. The display device according to claim 4, wherein the sensing circuit is configured to obtain the sensing voltage through the reference line of the sub-pixel.

7. A display device comprising:
a display panel including a sub-pixel for displaying an image, the display panel including:
a data line coupled to the sub-pixel;
a gate line coupled to the sub-pixel;
a reference line coupled to the sub-pixel;
a data driver configured to apply a data voltage to the data line of the sub-pixel;
a scan driver configured to apply a gate signal to the gate line of the sub-pixel;
a sensing circuit coupled to the sub-pixel, the sensing circuit including a first voltage circuit and a second voltage circuit, the first and second voltage circuits coupled to the reference line, the first voltage circuit configured to output a first reference voltage for a sensing mode and the second voltage circuit configured to output a second reference voltage for a driving mode;
a power supply; and
a compensator circuit configured to apply a sensing data voltage and at least one of the first reference voltage and the second reference voltage to the sub-pixel and compensate for a switching capability of at least one of transistors included in the sub-pixel based on a sensing voltage sensed from a sensing node of the sub-pixel,
wherein the first reference voltage is lower than the second reference voltage,
wherein the sensing mode includes obtaining a first sensing voltage to compensate for the deterioration of at least one of a driving transistor and a light emitting diode of the sub-pixel, and obtaining a second sensing voltage to compensate for the deterioration of at least one of a switching transistor and a sensing transistor of the sub-pixel,
wherein the second sensing voltage is repeatedly sensed and prepared as an average value, and
wherein an initial normal state of the switching transistor and the sensing transistor is set based on the average value, and the average value prepared in the initial normal state is stored in a memory included in a power supply.

8. The display device according to claim 7, wherein the compensator circuit is configured to compensate a gate voltage for turning on the at least one of the transistors included in the sub-pixel.

9. The display device according to claim 8, wherein the compensator circuit comprises:
a shift register configured to receive a compensated gate voltage generated based on the sensing voltage and output a gate signal compensated based on the compensated gate voltage.

10. A method of driving a display device, the method comprising:
obtaining a sensing value from a sub-pixel of a display panel displaying an image, including:
turning off a switching transistor, a driving transistor, and a sensing transistor coupled to a light emitting diode;
applying a sensing data voltage to a data line and also to a gate electrode node of a driving transistor through a turned on switching transistor;
applying a first reference voltage to a reference line and also to a source electrode node of the driving transistor through a turned on sensing transistor;
applying a first low-potential voltage to a first power line coupled to the light emitting diode;
turning on the driving transistor using, at least in part, a charged stored in a capacitor coupled to the driving transistor;
applying a sensing voltage to a sensing node of the driving transistor;
blocking the first reference voltage to the reference line;
applying a second low-potential voltage higher than the first low-potential voltage to the first power line coupled to the light emitting diode;
applying a sensing signal to a sampling circuit coupled to the reference line;
obtaining a first sensing voltage to compensate for the deterioration of at least one of the driving transistor and the light emitting diode of the sub-pixel;
obtaining a second sensing voltage to compensate for the deterioration of at least one of a switching transistor and a sensing transistor of the sub-pixel, the second sensing voltage being repeatedly sensed and prepared as an average value;
setting an initial normal state of the switching transistor and the sensing transistor based on the average value;
storing the average value prepared in the initial normal state in a memory;
obtaining at least one of first and second sensing voltages as the sensing value from the sub-pixel at the sampling circuit; and
when the sensing value is different from an initial value obtained during initial driving, compensating a switching capability of the at least one of transistors included in the sub-pixel.

11. The method according to claim 10, wherein the compensation comprises changing a gate voltage for turning on the at least one of the transistors included in the sub-pixel.

12. The method according to claim 10, wherein the compensation comprises raising a gate high voltage in correspondence with a decrease in the driving capability of at least one of a switching transistor and a sensing transistor included in the sub-pixel.

13. The method of claim 10 further including: compensating for the driving transistor.

14. The method of claim 10 further including: compensating for the light emitting diode of the sub-pixel.

15. The method of claim 10 wherein further including: compensating for the sensing transistor of the sub-pixel.